(12) United States Patent
Denegri

(10) Patent No.: US 7,688,114 B2
(45) Date of Patent: Mar. 30, 2010

(54) RATIO ASYMMETRIC INVERTERS, AND APPARATUS INCLUDING ONE OR MORE RATIO ASYMMETRIC INVERTERS

(75) Inventor: Claudio San Roman Denegri, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/121,149

(22) Filed: May 15, 2008

(65) Prior Publication Data

US 2009/0284283 A1  Nov. 19, 2009

(51) Int. Cl.
H03K 19/094 (2006.01)
(52) U.S. Cl. .......................................... 326/83; 326/29
(58) Field of Classification Search ............. 326/82–83, 326/86–87, 108, 109, 29; 327/170
See application file for complete search history.

(56) References Cited

U.S. PATENT DOCUMENTS 6,285,236 B1 * 9/2001 Stephens ..................... 327/391
6,366,151 B1 * 4/2002 Nakamura ................... 327/281
6,975,135 B1 * 12/2005 Bui ............................ 326/29

OTHER PUBLICATIONS

Li, Zhimin, et al. "A 14 Bit Continuous-Time Delta-Sigma A/D Modulator With 2.5 MHz Signal Bandwidth", IEEE Journal of Solid-State Circuits, vol. 42, No. 9, pp. 1873-1883, Sep. 2007.
Lin, Andrew C.Y., et al., "A CMOS Oversampled DAC With Multi-Bit Semi-Digital Filtering and Boosted Subcarrier SNR for ADSL Central Office Modems", IEEE Journal of Solid State Circuits, vol. 41, No. 4, pp. 868-875, Apr. 2006.
Mercer, Douglas A., "Low Power Approaches to High Speed CMOS Current Steering DACS", IEEE 2006 Custom Integrated Circuits Conference (CICC), pp. 153-160.
Kohno, Hiroyuki, et al, "A 350-MS/s 3.3-V 8-bit CMOS D/A Converter Using a Delayed Driving Scheme", IEEE 1995 Custom Integrated Circuits Conference, pp. 211-214.

* cited by examiner

Primary Examiner—James Cho

(57) ABSTRACT

A ratio asymmetric inverter has a signal input, signal output, first and second power inputs, pullup and pulldown transistors, and at least one delay element. The pullup transistor has a gate terminal, a source terminal coupled to the first power input, and a drain terminal coupled to the signal output. The pulldown transistor has a gate terminal, a drain terminal coupled to the signal output, and a source terminal coupled to the second power input. The signal input is respectively coupled to the gate terminals of the pullup transistor and the pulldown transistor via first and second signal paths. The at least one delay element is included in only one of the first and second signal paths, to impart a longer propagation delay to the one of the first and second signal paths.

19 Claims, 6 Drawing Sheets

RATIO ASYMMETRIC INVERTERS, AND APPARATUS INCLUDING ONE OR MORE RATIO ASYMMETRIC INVERTERS

BACKGROUND

A digital-to-analog (DAC) comprises one or more cells, each of which receives a sequence of digital values and outputs an analog signal that varies in response to state changes in the sequence of digital values. Often, a DAC cell comprises a current source and a current source driver.

FIG. 6 illustrates an exemplary one of many conventional DAC cells 600. The DAC cell 600 comprises a current source 604 and a current source driver 602. The current source driver 602 comprises a pair of inverters 606, 608 that receive a differential digital input signal (SEL, $\overline{SEL}$). In response to state changes of the differential digital input signal, the inverters 606, 608 cause first and second control signals (VG, $\overline{VG}$) to be driven between first and second reference voltages (Voff, Von). As one or the other of the first and second control signals is driven low, a respective one of a pair of current steering transistors 610, 612 is turned on, and current is steered between Iout and $\overline{Iout}$.

As shown in FIG. 7, the control signals (VG, $\overline{VG}$) are differential, with their edges crossing at or about the average value of the first and second reference voltages. Unfortunately, this produces a large glitch ($\Delta Vx$) in the voltage (Vx) at the tail node of the current source 604 (FIG. 6). The glitch can impact both settling performance and linearity of the DAC cell 600.

Various solutions for mitigating or eliminating the voltage glitch ($\Delta Vx$) have been proposed. However, these solutions often have other deleterious affects on a DAC cell, such as: undesired charge pumping between the first and second reference voltages, a need for more robust (higher power) reference drivers, an introduction of floating gate terminals, a need to use thick-oxide devices (resulting in lower speed switching).

BRIEF DESCRIPTION OF THE DRAWINGS

Illustrative embodiments of the invention are illustrated in the drawings, in which.

DETAILED DESCRIPTION

Figure 1:
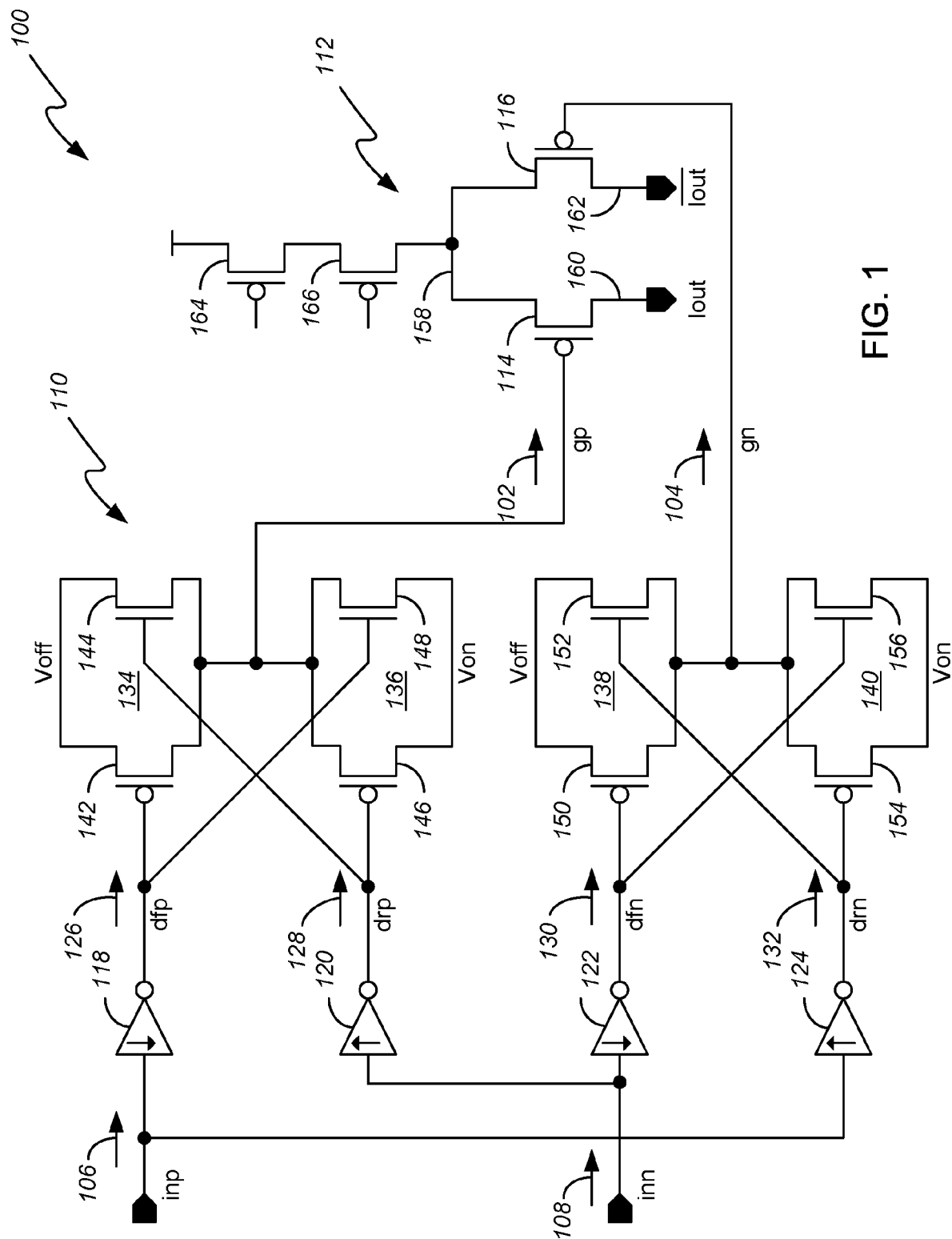
FIG. 1 illustrates exemplary apparatus for producing first and second control signals in response to a differential input signal.

FIG. 1 illustrates exemplary apparatus 100 for producing first and second control signals 102, 104 in response to a differential input signal 106/108. As shown, the apparatus 100 may be used as a current source driver 110, with the first and second control signals 102, 104 being coupled to first and second current steering transistors 114, 116 of a current source 112.

The apparatus 100 comprises first and second pairs of ratio asymmetric inverters 118/120, 122/124. For purposes of this description, a "ratio asymmetric inverter" is generally defined as an inverter that i) in response to a first type of state change at its signal input (i.e., a falling edge or a rising edge), initiates a state change at its signal output after a delay x, and 2) in response to a second type of state change at its signal input, initiates a state change at its signal output after a delay x+y. In other words, a ratio asymmetric inverter responds to different types of state changes with unequal delays. Preferably, the delay x is small (e.g., close to zero).

The first pair of ratio asymmetric inverters 118/120 inverts the differential input signal 106/108 to produce a first differential output signal 126/128. As will be disclosed in more detail later in this description, the first pair of ratio asymmetric inverters 118/120 has delay elements that cause the first pair of ratio asymmetric inverters 118/120 to respond to a first type of differential state change more slowly than a second type of differential state change.

The second pair of ratio asymmetric inverters 122/124 inverts the differential input signal 106/108 to produce a second differential output signal 130/132. The second pair of ratio asymmetric inverters 122/124 has delay elements that cause the second pair of ratio asymmetric inverters 122/124 to respond to the second type of differential state change more slowly than the first type of differential state change. In this manner, each of the first and second pairs of ratio asymmetric inverters 118/120, 122/124 responds more slowly to either the first type of differential state change or the second type of differential state change.

Each of the ratio asymmetric inverters 118, 120, 122, 124 is labeled in FIG. 1 with an up-arrow or down-arrow. These arrows indicate whether the ratio asymmetric inverters 118, 120, 122, 124 are of a rising edge type (up-arrow) or a falling edge type (down-arrow). Exemplary embodiments of each will be discussed later in this description.

In addition to the ratio asymmetric inverters 118, 120, 122, 124, the apparatus 100 comprises a number of transmission gates 134, 136, 138, 140. A first pair of transmission gates 134/136 is controlled by the first differential output signal 126/128, and a second pair of transmission gates 138/140 is controlled by the second differential output signal 130/132. Under control of the first differential output signal 126/128, the first pair of transmission gates 134/136 alternately drives the first control signal 102 to first and second reference voltages (Voff, Von). Under control of the second differential output signal 130/132, the second pair of transmission gates 138/140 alternately drives the second control signal 104 to the first and second reference voltages.

As shown, each of the transmission gates 134, 136, 138, 140 may comprise p-type and n-type transistors 142/144, 146/148, 150/152, 154/156 coupled in parallel via their drain and source terminals between one of the reference voltages (Voff, Von) and a control node (gp, gn). The gate terminals of the transistors 142, 144, 146, 148, 150, 152, 154, 156 are coupled to respective ones of the ratio asymmetric inverter outputs.

Figure 2:
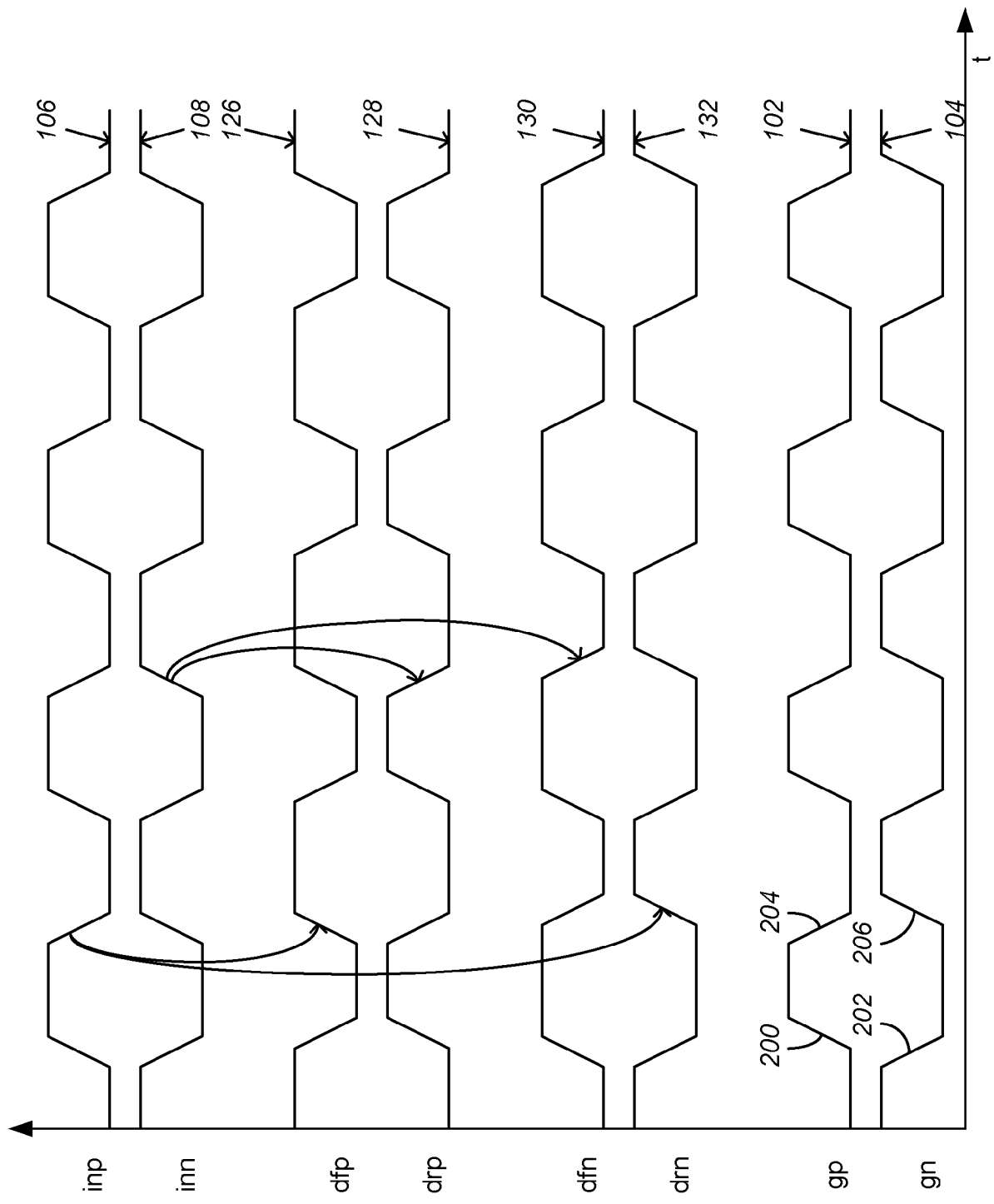
FIG. 2 illustrates exemplary waveforms appearing at the nodes inp, inn, dfp, drp, dfn, drn, gp and gn of the apparatus shown in FIG. 1.

FIG. 2 illustrates exemplary waveforms appearing at the nodes inp, inn, dfp, drp, dfn, drn, gp and gn of the apparatus 100. As shown, the node pairs inp/inn, dfp/drp and dfn/drn carry differential signals 106/108, 126/128 and 130/132. The control signals 102, 104 output on nodes gp and gn are not differential. However, they comprise sets of substantially differential edges 200/202, 204/206. As defined herein, "substantially differential edges" are edges that have a crossing point at other than an average value of the first and second reference voltages (Voff, Von). In FIG. 2, the crossing point of each set of substantially differential edges 200/202, 204/206 is below an average value of the first and second reference voltages.

Figure 3:
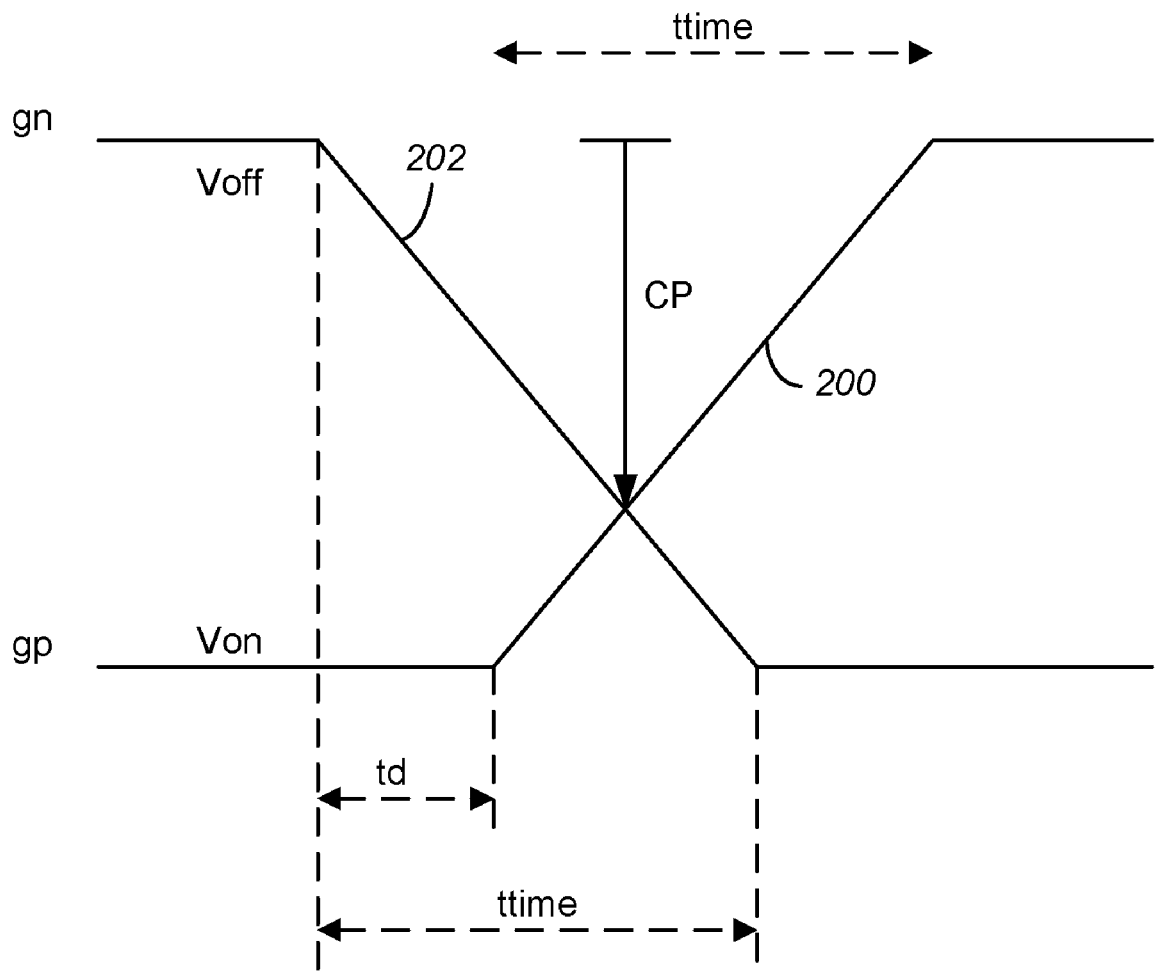
FIG. 3 illustrates, in greater detail, one of the sets of substantially differential edges shown in FIG. 2.

FIG. 3 illustrates a set of substantially differential edges 200/202 in more detail. As shown, the switching delays imparted to each edge 200, 202 are equal, and are assigned the value ttime. The delay imparted to the rising edge 200 at node gp is equal to td. Given the delays ttime and td, the crossing point (CP) is defined by the equation:

$$CP = \frac{ttime + td}{2 * ttime} * (Von - Voff) \quad \text{(Eq. 1)}$$

However, if $$\frac{ttime}{td} = \text{known\_constant} = k, \text{ then} \quad \text{Eq. 1}$$

can be rewritten in terms of k, as follows:

$$CP = \frac{k+1}{2*k} * (Von - Voff) \quad \text{(Eq. 2)}$$

In other words, if the ratio asymmetric inverters 118, 120, 122, 124 (FIG. 1) are sized to impart an equal switching delay to the rise and fall times of their output signals, and if a fixed delay ratio $$\frac{ttime}{td}$$

exists between i) a delay imparted by the delay element(s) of each ratio asymmetric inverter 118, 120, 122, 124, and ii) the equal switching delay, then the crossing point (CP) of the first and second control signals 102, 104 can be defined as a function of the fixed delay ratio. Exemplary ways to achieve and maintain a fixed delay ratio will be discussed later in this description.

Referring back to FIG. 1, it is noted that the exemplary current source 112 comprises first and second current steering transistors 114, 116. Each of the current steering transistors 114, 116 has a source terminal coupled to a common current input node 158, a drain terminal coupled to a respective one of first and second current output nodes 160, 162, and a gate terminal that receives a respective one of the first and second control signals 102, 104. Current may be provided to the common current input node 158 via a number of transistors 164, 166 that are connected in series between the common current input node 158 and a power input.

Figure 4:
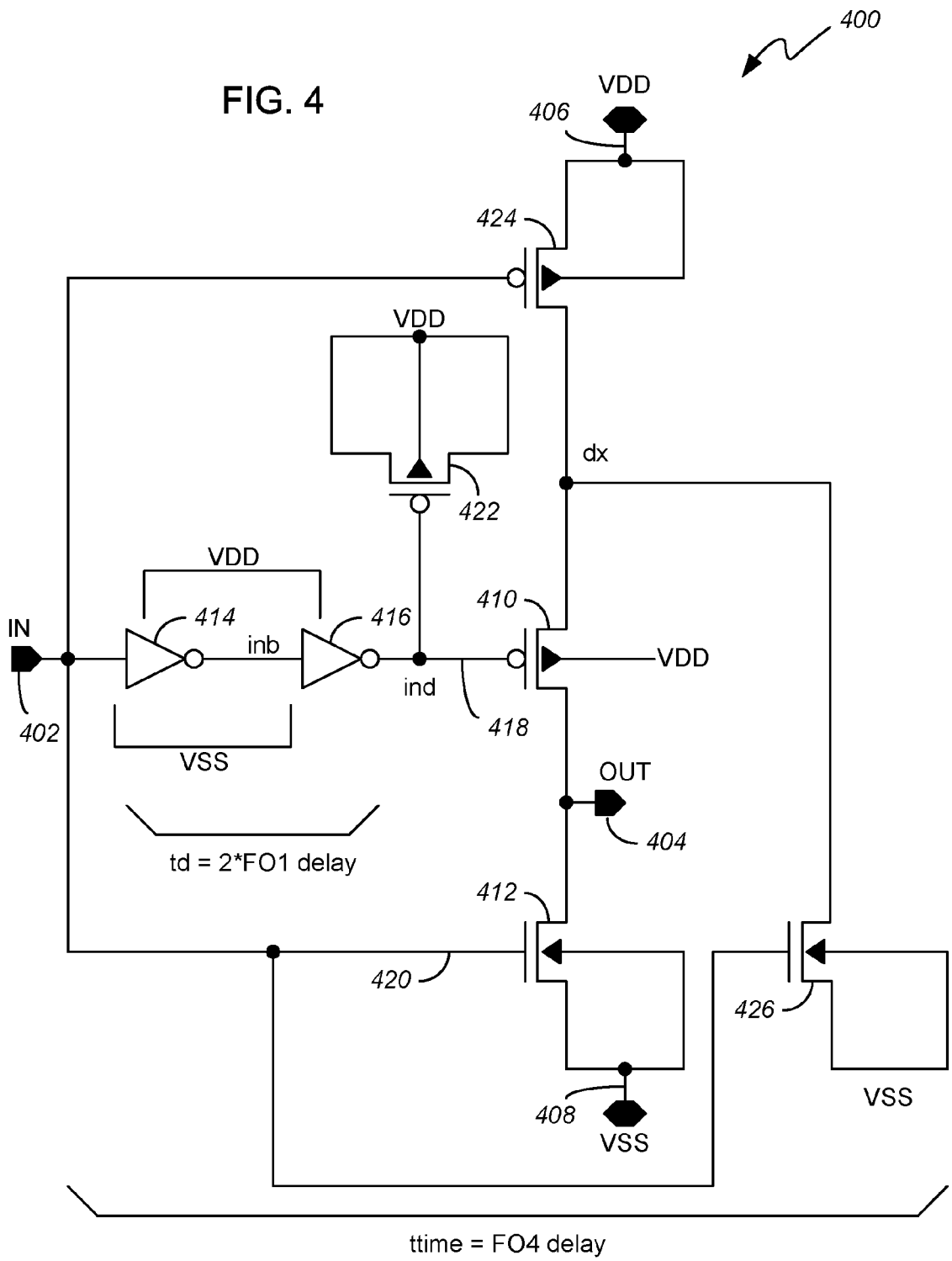
FIG. 4 illustrates an exemplary embodiment of a rising edge ratio asymmetric inverter.
Figure 5:
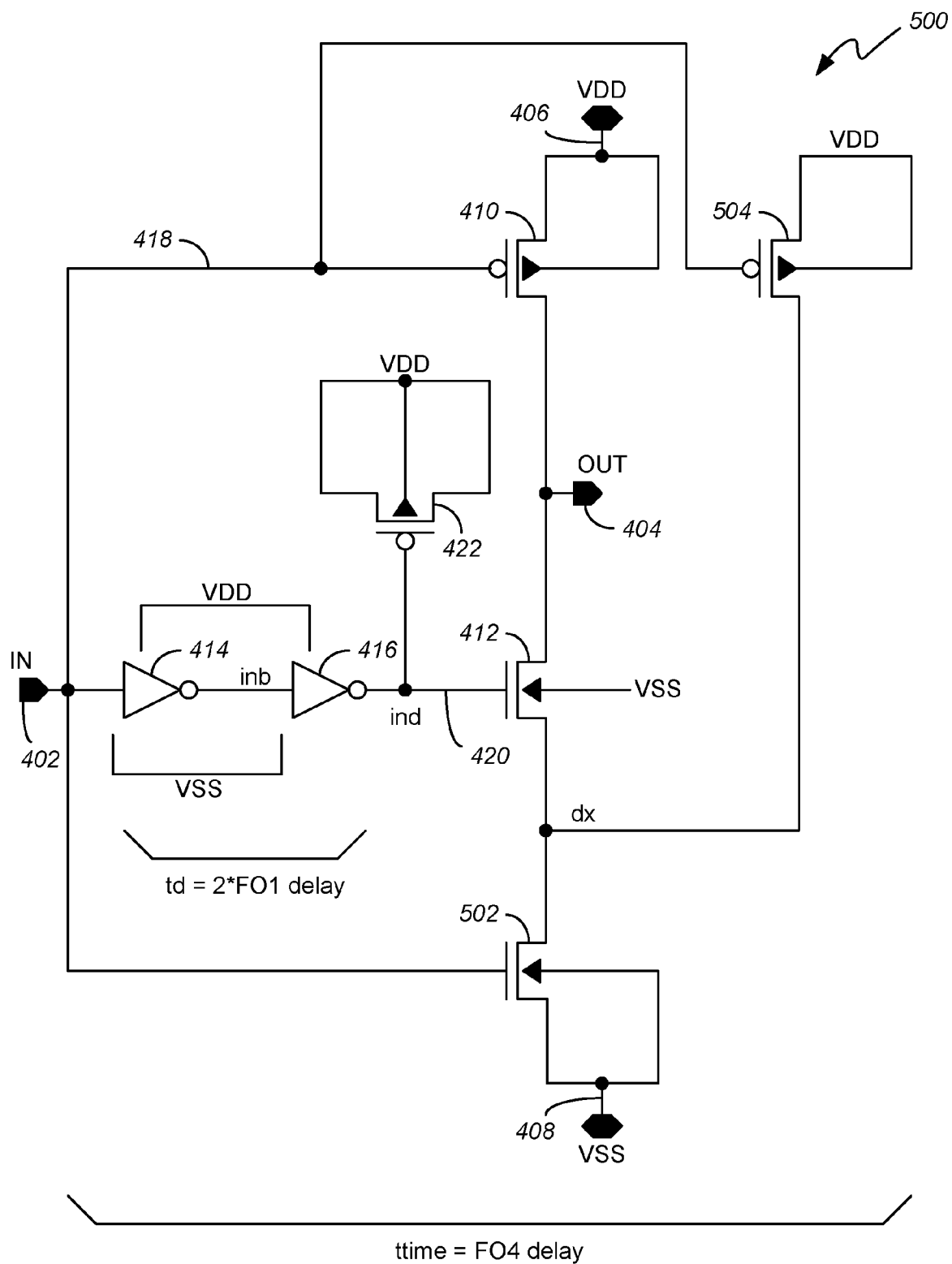
FIG. 5 illustrates an exemplary embodiment of a falling edge ratio asymmetric inverter.
Figure 6:
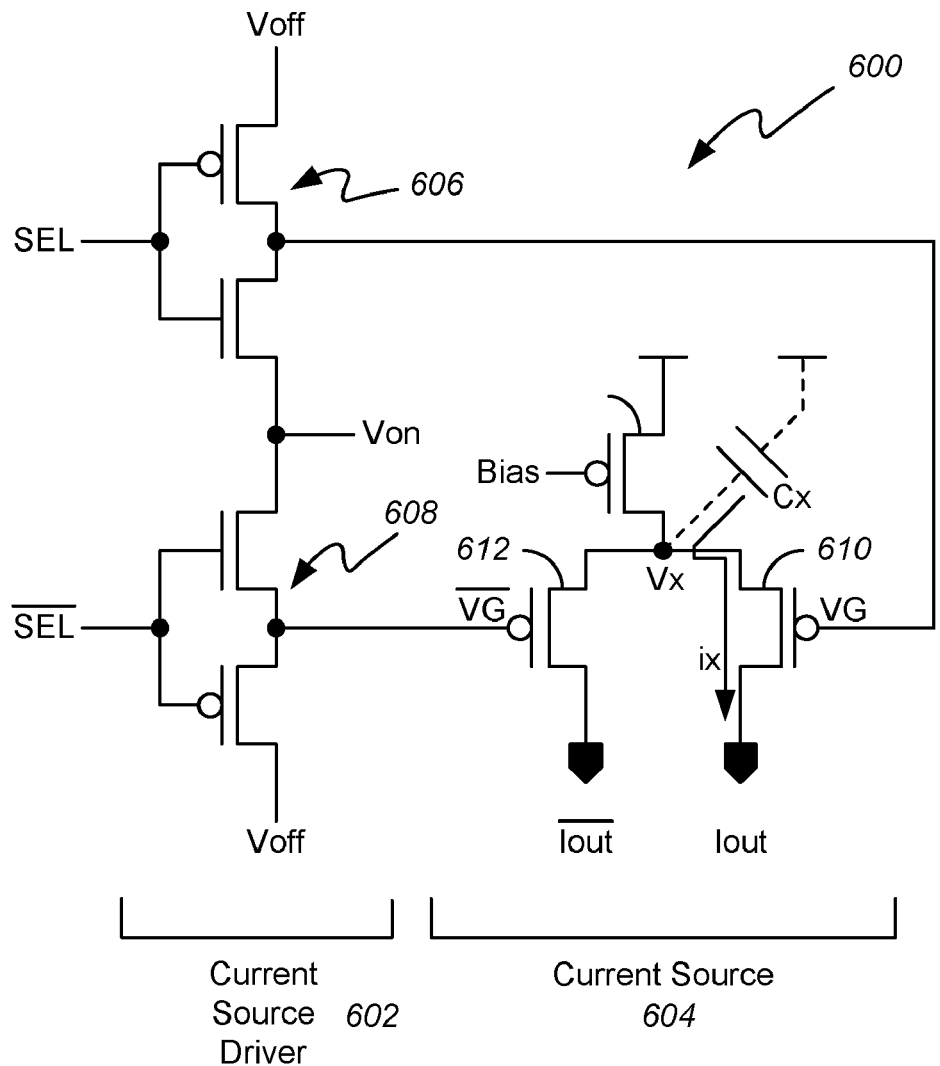
FIG. 6 illustrates an exemplary one of many conventional DAC cells.
Figure 7:
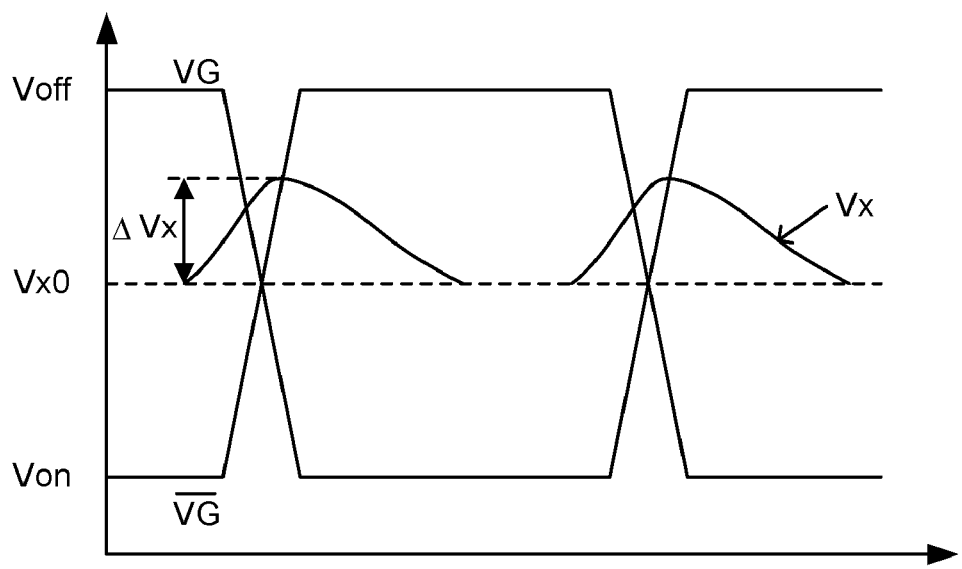
FIG. 7 illustrates a large glitch ($\Delta Vx$) in the voltage (Vx) at the tail node of the current source shown in FIG. 6.

FIGS. 4 & 5 illustrate exemplary respective embodiments of a rising edge ratio asymmetric inverter 400 (FIG. 4) and a falling edge ratio asymmetric inverter 500 (FIG. 5). In general, each of the ratio asymmetric inverters comprises a signal input 402, a signal output 404, first and second power inputs 406, 408, a pullup transistor 410, a pulldown transistor 412, and at least one delay element 414, 416. The pullup transistor 410 has a gate terminal, a source terminal coupled to the first power input 406, and a drain terminal coupled to the signal output 404. The pulldown transistor 412 has a gate terminal, a drain terminal coupled to the signal output 404, and a source terminal coupled to the second power input 408. The signal input 402 is respectively coupled to the gate terminals of the pullup transistor 410 and the pulldown transistor 412, via first and second signal paths 418, 420. The at least one delay element 414, 416 is included in only one of the first and second signal paths 418, 420, to impart a longer propagation delay (td) to the one of the first and second signal paths 418, 420. In the rising edge ratio asymmetric inverter 400, the delay element(s) 414, 416 are included in the first signal path 418. In the falling edge ratio asymmetric inverter 500 (FIG. 5), the delay element(s) 414, 416 are included in the second signal path 420.

In some embodiments, the transistors 404, 412 of the ratio asymmetric inverters 400, 500 are sized to impart an equal switching delay to the rise and fall times of a signal produced at the signal output 404. Also, a fixed delay ratio may be provided between i) the longer propagation delay (td) imparted to one of the signal paths 418, 420, and ii) the equal switching delay (ttime). In some embodiments, the equal switching delay is a fanout-of-4 (FO4) switching delay, and the delay imparted by the first set of delay elements 414, 416 is two times a fanout-of-1 (FO1) switching delay.

In some embodiments, the at least one delay element 414, 416 may comprise a string of inverters. In this manner, the delay imparted by the string of inverters may be established by appropriately sizing the transistors of the inverters. By forming all of the transistors 410, 412 and inverters 414, 416 of the ratio asymmetric inverters 400, 500 (FIGS. 4 & 5) via a common process (e.g., a MOS or CMOS process), the fixed delay ratio may be made relatively immune to process and condition variations.

Optionally, a circuit element may be coupled to the output of the string of inverters, to balance a load of a last inverter 416 in the string of inverters and thereby maintain uniform desired delays (e.g., FO1 delays) for each of the inverters 404, 406 in the string. In some cases, the circuit element may be a load balancing transistor 422 having a gate terminal coupled to the output of the string of inverters, and drain and source terminals coupled to the first power input 406.

Referring now specifically to the rising edge ratio asymmetric inverter 400 shown in FIG. 4, the ratio asymmetric inverter 400 may further comprise a second pullup transistor 424, coupled in series with the first pullup transistor 410. The second pullup transistor 424 has a source terminal coupled to the first power input 406, a drain terminal coupled to the source terminal of the first pullup transistor 410, and a gate terminal coupled to the signal input 402. The second pullup transistor 424 helps mitigate crowbar current, because it turns off earlier than the first pullup transistor 410.

The rising edge ratio asymmetric inverter 400 may also comprise a second pulldown transistor 426. The second pulldown transistor 426 has a gate terminal coupled to the signal input 402, a drain terminal coupled to the source terminal of the first pullup transistor 410, and a source terminal coupled to the second power input 408. The second pulldown transistor 426 pulls down node dx to improve the switching delay when the signal output 404 is switched from high-to-low.

Referring now to the falling edge ratio asymmetric inverter 500 shown in FIG. 5, the ratio asymmetric inverter 500 may further comprise a second pulldown transistor 502, coupled in series with the first pulldown transistor 412. The second pulldown transistor 502 has a drain terminal coupled to the source terminal of the first pulldown transistor 412, a source terminal coupled to the second power input 408, and a gate terminal coupled to the signal input 402. The second pulldown transistor 502 helps mitigate crowbar current, because it turns off earlier than the first pulldown transistor 412.

The falling edge ratio asymmetric inverter 500 may also comprise a second pullup transistor 504. The second pullup transistor 504 has a gate terminal coupled to the signal input 402, a source terminal coupled to the first power input 406, and a drain terminal coupled to the source terminal of the first pulldown transistor 412. The second pullup transistor 504 pulls up node dx to improve the switching delay when the signal output 404 is switched from low-to-high.

When constructed with ratio asymmetric inverters 400, 500 such as those shown in FIGS. 4 & 5, the apparatus 100 shown in FIG. 1 can provide several benefits. For one, it minimizes the voltage glitch ($\Delta Vx$) at the current input node (or tail node) 158 of the current source 112. The existence of this glitch is one of the main sources of error in current-steering DACs.

Not only can the apparatus 100 minimize the voltage glitch at the current input node 158, but, when the transistors and inverters of the apparatus 100 are formed via a common process, the fixed delay ratio $$\frac{ttime}{td}$$

ensures that the voltage glitch is minimized uniformly across process and condition variations.

The apparatus 100 is also relatively small and can be constructed using high speed logic. It does not require the use of thick-oxide devices. This preserves fast edges and reduces jitter effects. It also enables the circuit that supplies the differential input signal 106/108 to be faster (e.g., a low-swing comparator).

The apparatus 100 also presents no undesired charge pumping of the first and second reference voltages (Voff, Von). As a result, the voltage reference drivers can be constructed as lower power devices.

The apparatus 100 also ensures that none of the gate terminals of the current source 112 float during signal transitions.

The apparatus 100 also dissipates zero DC power.

What is claimed is:

1. Apparatus, responsive to a differential input signal having first and second types of differential state changes, comprising:
    a first pair of ratio asymmetric inverters for inverting the differential input signal to produce a first differential output signal, the first pair of ratio asymmetric inverters having delay elements that cause the first pair of ratio asymmetric inverters to respond to a first type of differential state change more slowly than a second type of differential state change;
    a second pair of ratio asymmetric inverters for inverting the differential input signal to produce a second differential output signal, the second pair of ratio asymmetric inverters having delay elements that cause the second pair of ratio asymmetric inverters to respond to a second type of differential state change more slowly than a first type of differential state change;
    a first pair of transmission gates, controlled by the first differential output signal, for alternately driving a first control signal to first and second reference voltages; and
    a second pair of transmission gates, controlled by the second differential output signal, for alternately driving a second control signal to the first and second reference voltages, the first and second control signals having substantially differential edges that have a crossing point below an average value of the first and second reference voltages.

2. The apparatus of claim 1, wherein the ratio asymmetric inverters are sized to impart an equal switching delay to the rise and fall times of their output signals, and wherein a fixed delay ratio exists between i) a delay imparted by the delay element(s) of each ratio asymmetric inverter, and ii) the equal switching delay.

3. The apparatus of claim 2, wherein the equal switching delay is a fanout-of-4 (FO4) switching delay, and wherein the delay imparted by the first set of delay elements is two times a fanout-of-1 (FO1) switching delay.

4. The apparatus of claim 1, wherein each of the delay elements comprises a string of inverters.

5. The apparatus of claim 1, wherein each of the ratio asymmetric inverters:
    a signal input;
    a signal output;
    first and second power inputs;
    a first pullup transistor having a gate terminal, a source terminal coupled to the first power input, and a drain terminal coupled to the signal output; and
    a first pulldown transistor having a gate terminal, a drain terminal coupled to the signal output, and a source terminal coupled to the second power input;
    wherein the signal input is respectively coupled to the gate terminals of the pullup transistor and the pulldown transistor via first and second signal paths, and wherein the delay elements are included in only one of the first and second signal paths, to impart a longer propagation delay to the one of the first and second signal paths.

6. The apparatus of claim 5, wherein each of the delay elements comprises a string of inverters, and wherein each of the ratio asymmetric inverters comprises a circuit element coupled to an output of its string of inverters, to balance a load of a last inverter in its string of inverters.

7. The apparatus of claim 5, wherein each of the first and second pairs of ratio asymmetric inverters comprises a rising edge ratio asymmetric inverter, wherein the delay elements of each rising edge ratio asymmetric inverter are included in the first signal path of the ratio asymmetric inverter, and wherein each of the rising edge ratio asymmetric inverters further comprises:
    a second pullup transistor, coupled in series with the first pullup transistor, the second pullup transistor having a source terminal coupled to the first power input, a drain terminal coupled to the source terminal of the first pullup transistor, and a gate terminal coupled to the signal input.

8. The apparatus of claim 5, wherein each of the first and second pairs of ratio asymmetric inverters comprises a falling edge ratio asymmetric inverter, wherein the delay elements of each falling edge ratio asymmetric inverter are included in the second signal path of the ratio asymmetric inverter, and wherein each of the falling edge ratio asymmetric inverters further comprises:
    a second pulldown transistor, coupled in series with the first pulldown transistor, the second pulldown transistor having a drain terminal coupled to the source terminal of the first pulldown transistor, a source terminal coupled to the second power input, and a gate terminal coupled to the signal input.

9. The apparatus of claim 1, further comprising first and second current steering transistors, each of the current steering transistors having a source terminal coupled to a common current input node, a drain terminal coupled to a respective one of first and second current output nodes, and a gate terminal that receives a respective one of the first and second control signals.

10. A ratio asymmetric inverter, comprising:
a signal input;
a signal output;
first and second power inputs;
a first pullup transistor having a gate terminal, a source terminal coupled to the first power input, and a drain terminal coupled to the signal output;
a first pulldown transistor having a gate terminal, a drain terminal coupled to the signal output, and a source terminal coupled to the second power input; and
at least one delay element, wherein the signal input is respectively coupled to the gate terminals of the first pullup transistor and the first pulldown transistor via first and second signal paths, and wherein the at least one delay element is included in only one of the first and second signal paths, to impart a longer propagation delay to the one of the first and second signal paths;
wherein the transistors of the ratio asymmetric inverter are sized to impart an equal switching delay to the rise and fall times of a signal produced at the signal output, and wherein a fixed delay ratio exists between i) the longer propagation delay imparted to the one of the first and second signal paths, and ii) the equal switching delay.

11. The ratio asymmetric inverter of claim 10, wherein the equal switching delay is a fanout-of-4 (FO4) switching delay, and wherein the delay imparted by the first set of delay elements is two times a fanout-of-1 (FO1) switching delay.

12. The ratio asymmetric inverter of claim 10, wherein the at least one delay element comprises a string of inverters.

13. The ratio asymmetric inverter of claim 12, wherein all of the transistors and inverters of the ratio asymmetric inverter are formed via a common process.

14. The ratio asymmetric inverter of claim 10, wherein the at least one delay element is included in the first signal path, the ratio asymmetric inverter further comprising:
a second pullup transistor, coupled in series with the first pullup transistor, the second pullup transistor having a source terminal coupled to the first power input, a drain terminal coupled to the source terminal of the first pullup transistor, and a gate terminal coupled to the signal input.

15. The ratio asymmetric inverter of claim 14, wherein the ratio asymmetric inverter further comprises a second pulldown transistor having a gate terminal coupled to the signal input, a drain terminal coupled to the source terminal of the first pullup transistor, and a source terminal coupled to the second power input.

16. The ratio asymmetric inverter of claim 10, wherein the at least one delay element is included in the second signal path, the ratio asymmetric inverter further comprising:
a second pulldown transistor, coupled in series with the first pulldown transistor, the second pulldown transistor having a drain terminal coupled to the source terminal of the first pulldown transistor, a source terminal coupled to the second power input, and a gate terminal coupled to the signal input.

17. The ratio asymmetric inverter of claim 16, wherein the ratio asymmetric inverter further comprises a second pullup transistor having a gate terminal coupled to the signal input, a source terminal coupled to the first power input, and a drain terminal coupled to the source terminal of the first pulldown transistor.

18. A ratio asymmetric inverter, comprising:
a signal input;
a signal output;
first and second power inputs;
a first pullup transistor having a gate terminal, a source terminal coupled to the first power input, and a drain terminal coupled to the signal output;
a first pulldown transistor having a gate terminal, a drain terminal coupled to the signal output, and a source terminal coupled to the second power input;
at least one delay element, wherein the signal input is respectively coupled to the gate terminals of the first pullup transistor and the first pulldown transistor via first and second signal paths, wherein the at least one delay element is included in only one of the first and second signal paths, to impart a longer propagation delay to the one of the first and second signal paths, and wherein the at least one delay element comprises a string of inverters; and
a circuit element coupled to an output of the string of inverters, to balance a load of a last inverter in the string of inverters.

19. The ratio asymmetric inverter of claim 18, wherein the circuit element is a load balancing transistor having a gate terminal coupled to the output of the string of inverters.

* * * * *